United States Patent [19]

Morimoto et al.

[11] Patent Number: 4,539,054
[45] Date of Patent: Sep. 3, 1985

[54] AMORPHOUS FILM OF TRANSITION ELEMENT-SILICON COMPOUND

[75] Inventors: Kiyoshi Morimoto, Mobara; Toshinori Takagi, Nagaokakyo, both of Japan

[73] Assignee: Futaba Denshi Kogyo K.K., Mobara, Japan

[21] Appl. No.: 490,535

[22] Filed: May 2, 1983

[30] Foreign Application Priority Data

Apr. 30, 1982 [JP] Japan .................. 57-71419

[51] Int. Cl.³ ............................ C22C 28/00
[52] U.S. Cl. .................. 148/403; 420/578; 252/403
[58] Field of Search .............. 420/578; 148/403; 252/62.3 E

[56] References Cited

U.S. PATENT DOCUMENTS 3,472,708 10/1964 Schindler et al. .................. 420/578
4,231,816 11/1980 Cuomo et al. .................. 148/403

FOREIGN PATENT DOCUMENTS 53-11112 2/1978 Japan .................. 420/578

Primary Examiner—L. Dewayne Rutledge
Assistant Examiner—Debbie Yee
Attorney, Agent, or Firm—Oblon, Fisher, Spivak, McClelland & Maier

[57] ABSTRACT

An amorphous film formed of a transition element-silicon compound which has excellent electric and optical characteristics is disclosed. The compound is amorphous and has a Si content of 60–85 at. %.

6 Claims, 7 Drawing Figures

AMORPHOUS FILM OF TRANSITION ELEMENT-SILICON COMPOUND

BACKGROUND OF THE INVENTION

1. Field of the Invention

This invention relates to an amorphous film formed of silicide of a transition element and more particularly to an amorphous film formed of a transition element-silicon compound and having excellent electrical and optical characteristics.

2. Description of the Prior Art

There has been conventionally known in the art an iron-silicon (Fe-Si) compound which is prepared according to a thermal procedure or melting method. Such conventional method is adapted to utilize a dissolving reaction under thermal equilibrium conditions. Thus, it requires to go through the steps of melting Fe and Si in a vacuum atmosphere or an inert atmosphere and then cooling the melting bath. However, such process from the melting step to the cooling step causes the Fe-Si system to be crystallized according its phase diagram to form a Fe-Si compound having a polycrystalline or single-crystal structure. Thus, an amorphous film is never formed of a transition element-silicon compound according to the conventional method.

BRIEF SUMMARY OF THE INVENTION

The present invention has been made in view of the foregoing disadvantage of the prior art while taking notice of the fact that an ion technology is used to form a novel amorphous film of a transition element-silicon compound.

Accordingly, it is an object of the present invention to provide an amorphous film of a transition element-silicon compound.

It is another object of the present invention to provide an amorphous film of a transition element-silicon compound which has excellent electrical and optical characteristics.

In accordance with the present invention, there is provided an amorphous film formed of a transition element-silicon compound, wherein the compound mainly consists of a transition element and silicon. In the compound, a silicon content is 60–85 atom percent (hereinafter abbreviated to "at. %") and the compound is of amorphous structure.

BRIEF DESCRIPTION OF THE DRAWINGS

Other objects and many of the attendant advantages of the present invention will be readily appreciated as the same becomes better understood by reference to the following detailed description when considered in connection with the accompanying drawings, wherein.

DETAILED DESCRIPTION OF THE PREFERRED EMBODIMENT

Figure 1:
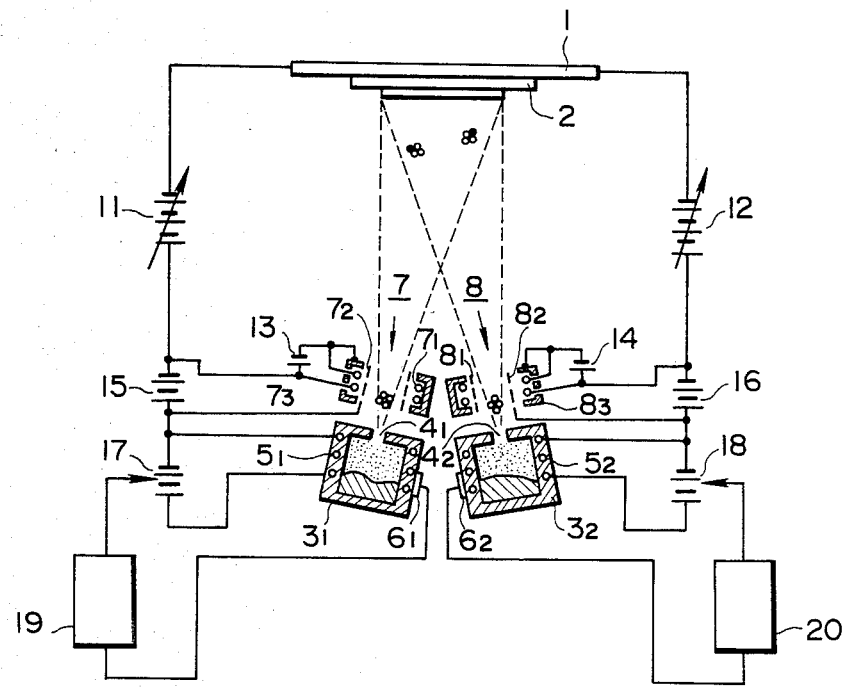
FIG. 1 is a schematic view showing one example of an apparatus suitable for use in the preparation of an amorphous film of a transition element-silicon compound according to the present invention.

First, an amorphous film of a Fe-Si compound which is one embodiment of an amorphous film of a transition element-silicon compound according to the present invention prepared according to a cluster ion beam deposition method (hereinafter referred to "CIBD method") using an apparatus schematically shown in FIG. 1 will be explained hereinafter. The apparatus shown in FIG. 1 is adapted to eject vapors of Fe and Si from two closed-type crucibles separate from each other to carry out the deposition on a substrate.

More particularly, the apparatus includes a holder 1 for holding a substrate 2 on which an amorphous film is to be deposited. The apparatus also includes two closed-type crucibles $3_1$ and $3_2$ disposed separate from each other, each of which has at least one injection nozzle $4_1$ ($4_2$) of a small diameter. The crucibles are respectively charged therein with Fe and Si which are component elements of the compound. The crucibles $3_1$ and $3_2$ respectively have heating elements $5_1$ and $5_2$ embedded in the outer wall thereof so that the crucibles may be heated by resistance heating. The crucibles $3_1$ and $3_2$ are also provided on the outer wall thereof with thermocouples $6_1$ and $6_2$ which act to measure temperatures of the crucibles, respectively.

Adjacent to the injection nozzles $4_1$ and $4_2$, ionization chambers 7 and 8 are arranged which comprise filaments $7_1$ and $8_1$ for emitting thermions therefrom acceleration electrodes $7_2$ and $8_2$ for accelerating thermions emitted from the filaments $7_1$ and $8_1$, and shielding plates $7_3$ and $8_3$ for preventing the undesired fly of thermions, respectively.

The apparatus further includes acceleration power sources 11 and 12 of which outputs are variable from the outside as desired. The power sources 11 and 12 are adapted to keep the holder 1 at a high negative potential with respect to the ionization chambers 7 and 8 to impart kinetic energy to positively ionized particles to allow the particles to impinge on the substrate. Reference numerals 13 and 14 indicate power sources for heating the filaments $7_1$ and $8_1$ of the ionization chambers 7 and 8 to permit the filaments to emit thermions, and reference numerals 15 and 16 designate ionization power sources which act to keep the acceleration electrodes $7_2$ and $8_2$ at a high positive potential with respect to the filaments $7_1$ and $8_1$ to accelerate thermions emitted from the filaments to permit thermions to be bombarded with vaporized particles in the ionization chambers 7 and 8, so that the particles may be ionized. Furthermore, the apparatus includes power sources 17 and 18 for supplying electrical current to the heating elements $5_1$ and $5_2$ to heat the crucibles $3_1$ and $3_2$, of which outputs are also variable from the outside as desired.

Reference numerals 19 and 20 indicate temperature control sections which are adapted to receive outputs of the thermocouples $6_1$ and $6_2$ provided on the crucibles $3_1$ and $3_2$ to control temperatures of the crucibles. More particularly, the temperature control sections 19 and 20 serve to compare temperatures of the crucibles $3_1$ and $3_2$ detected by the thermocouples $6_1$ and $6_2$ with preset temperatures of the sections 19 and 20 to control the outputs of the power sources 17 and 18 depending upon the differences between the both temperatures, to thereby control temperatures of the crucibles. This allows vapor pressures within the crucibles to be kept at predetermined values.

The apparatus shown in FIG. 1 is encapsulated in a vacuum casing (not shown) except the power sources 11 to 18 and the temperature control sections 19 and 20. The vacuum casing is evacuated through a suitable evacuation system to permit the apparatus to be placed in a high vacuum atmosphere of $10^{-2}$ Torr or less, preferably $10^{-4}$ Torr or less.

In the embodiment, as materials to be charged in the crucibles $3_1$ and $3_2$, Fe and Si were used which have a high purity above 99.99 %. Fe and Si charged in the crucibles were then heated to a high temperature to be vaporized therein. The vaporized materials were ejected through the injection nozzle $4_1$ and $4_2$ into the high vacuum region to form clusters and then ionized. Then, the ionized clusters were deposited on the substrate 2 formed of, for example, glass. In preparation of the Fe-Si amorphous film of the present embodiment, the crucible $3_1$ having Fe charged therein was substantially kept at a temperature of 1600° C. and the crucible $3_2$ of Si was varied within a range between 1600° C. and 2000° C., to thereby prepare amorphous films different in composition ratio. The vacuum region was kept at a pressure of $5 \times 10^{-6}$ Torr during the deposition and the substrate was kept at a temperature of 150° C. Also, only the clusters of Fe were ionized and the ionization of clusters of Si was not made during the deposition. However, the inventors' experiment proved that the ionization of both clusters of Fe and Si meets with the substantially same results as the present embodiment. Furthermore, in the embodiment, ionization current Ie for Fe was set at about 200 mA. Acceleration voltages Va for Fe and Si were set at zero. In other words, the clusters of Fe and Si have kinetic energy corresponding to the injection velocity from the nozzle. The acceleration voltages, as described hereinbefore, may be varied by means of the power sources 11 and 12 as desired.

A composition ratio in a film prepared under the above-mentioned conditions was calculated on the basis of its density and film thickness measured by means of a double interference microscope. It was found that the film thus formed is glossy and blue-black, and has a very flat surface. Further, an X-ray diffractometry verified that the film is completely amorphous.

Figure 2:
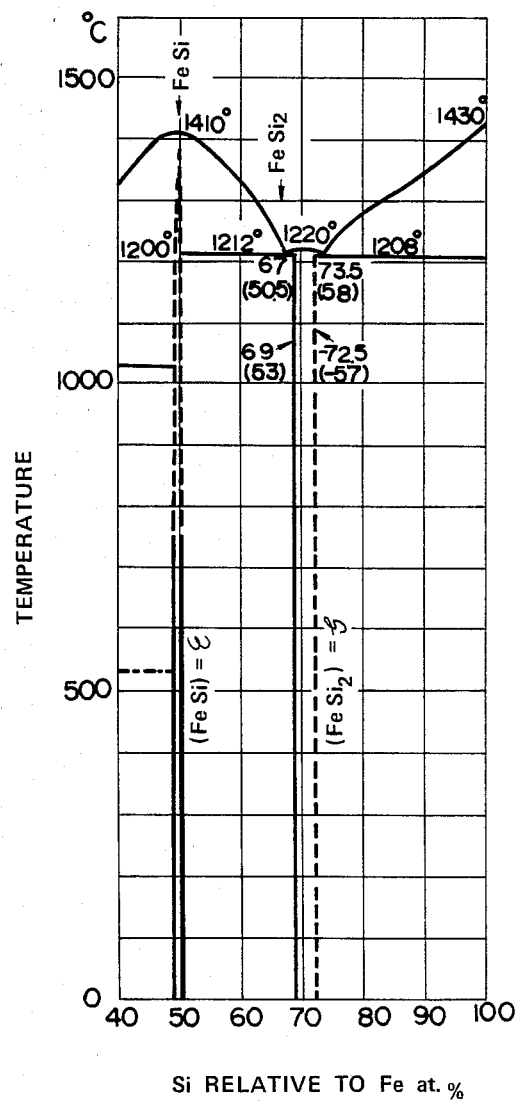
FIG. 2 shows the main part of a Fe-Si two component system phase diagram relating to one embodiment of an amorphous film according to the present invention.

The main portion of a two-component phase diagram of a Fe-Si compound is shown in FIG. 2. In the embodiment of the present invention, the amorphous film was prepared taking notice of a $\zeta$-FeSi$_2$ phase (crystal structure; tetragonal system; lattice constants; a=2.692 Å, c=5.137 Å, c/a≃1.908: numbers of atom per unit cell; 3) which is capable of forming a stable solid solution when Si is present at the range between 69 at. % and 72.5 at. %, as shown in FIG. 2. Also, thermoelectric, electric and optical properties of the film were considered. For comparison, an amorphous film formed of a $\epsilon$-FeSi phase in which a composition ratio of Fe to Si is 1:1 was prepared and considered.

Figure 3:
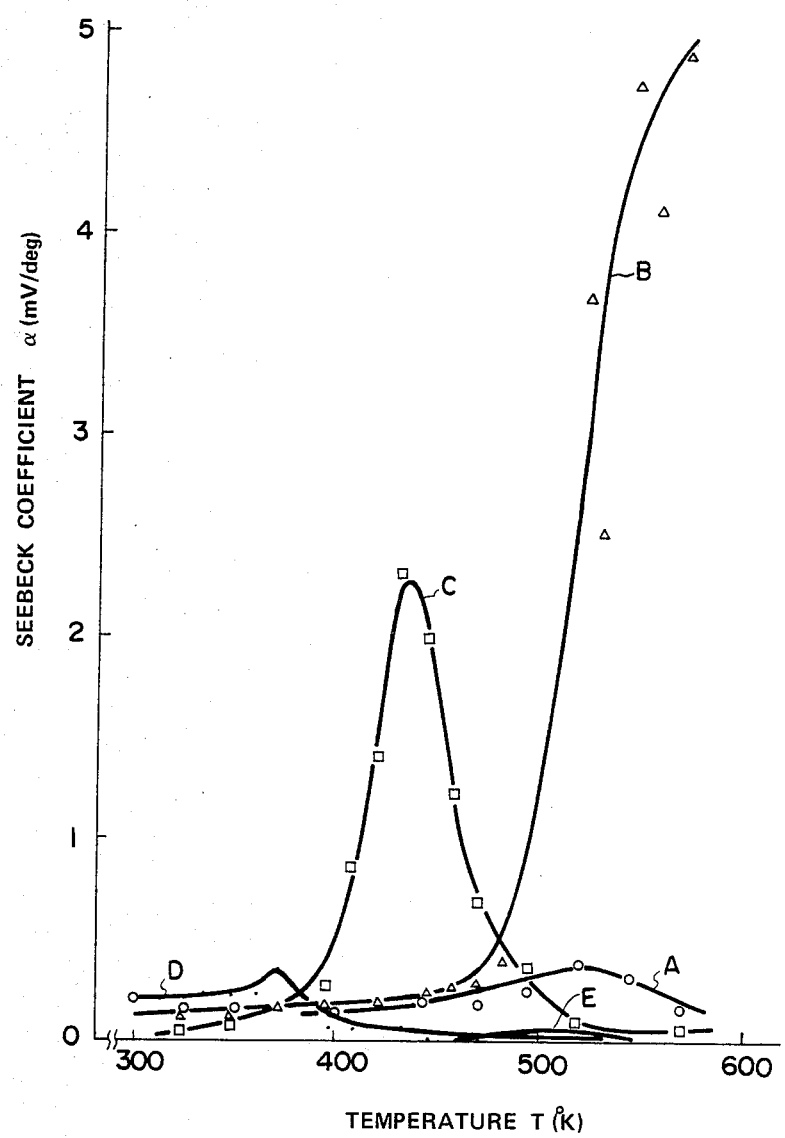
FIG. 3 is a graphical representation showing temperature characteristics of positive Seebeck coefficient of a transition element-silicon amorphous film according to the present invention.

FIG. 3 shows measured temperature characteristics of a Seebeck coefficient (thermoelectromotive force per unit temperature) of each of the amorphous films formed of $\zeta$-FeSi$_2$ phase and $\epsilon$-FeSi phase. In FIG. 3, curves A, B, C and D relate to the amorphous films of the present invention formed of $\zeta$-FeSi$_2$ phase wherein composition ratios of Si to Fe are 68 at. %, 72 at. %, 80 at. % and 83 at. %, respectively. Curve E indicates an amorphous film of $\epsilon$-FeSi phase in which a composition ratio of Si to Fe is 50 at. %. As can be seen from FIG. 3, the film of $\epsilon$-FeSi phase indicated by curve E has a Seebeck coefficient of about +40 μV/deg which provides the film with metallic properties, whereas the film indicated by B wherein Si of 72 at. % is contained in the solid solution region of $\zeta$-FeSi$_2$ phase has a large Seebeck coefficient of about ±15 mV/deg at a temperature of 550° K. The Seebeck coefficient gradually decreases as the content of Si exceeds a range of Si in the solid solution. That is, a Seebeck coefficient of the film having a Si content of 80 at. % is about ±2.2 mV/deg, whereas the film having a Si content of about 83 at. % has a Seebeck coefficient of about +300 μV/deg. Further, the increase of a Si content in the film causes the maximum value of Seebeck coefficient to be transferred to a low temperature side.

Figure 4:
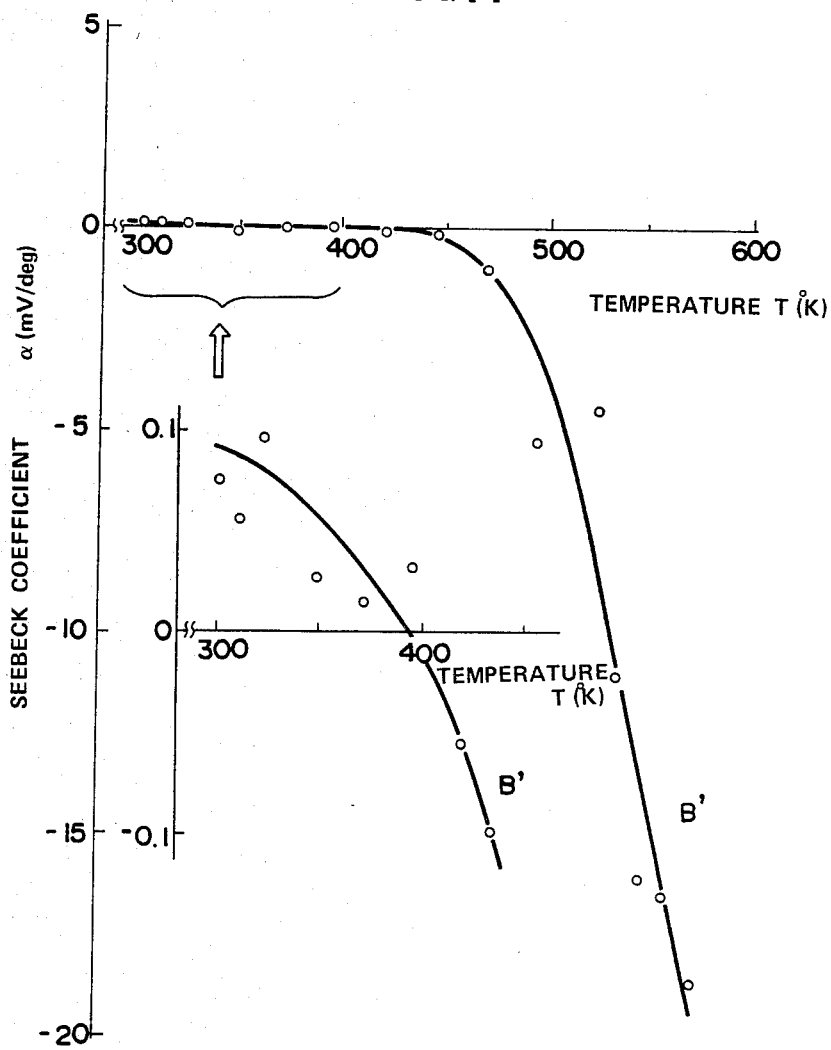
FIG. 4 is a graphical representation showing temperature characteristics of negative Seebeck coefficient of an amorphous film according to the present invention.

The amorphous films of the present embodiment formed of $\zeta$-FeSi$_2$, as apparent from the results shown in FIG. 3, each are of a p-conduction type (positive type). It was found that a film prepared by introducing a very small amount of oxygen thereinto during the deposition has its conduction type inverted into an n-type (negative type). FIG. 4 shows temperature characteristics of Seebeck coefficient of an amorphous film according to another embodiment of the present invention prepared by introducing oxygen of about 1-5 ωt. % into the $\zeta$-FeSi$_2$ phase having a Si content of 70 at. %, wherein the film is indicated by B'. The portion of FIG. 4 indicated by an arrow wherein the Seebeck coefficient is inverted at a temperature near 300°-400° K. is enlargely shown below the arrow for clarification.

As seen from FIG. 4, the amorphous film of $\zeta$-FeSi$_2$ phase, when a very small amount of oxygen is introduced thereinto, has its conduction type from a p-type to an n-type at a temperature of about 400° K. Also, the amorphous film starts to suddenly increase in Seebeck coefficient at a temperature of about 450° K. and has a large Seebeck coefficient of about −20 mV/deg at about 580° K. A reason why a conduction type of the amorphous film was inverted although it has a composition similar to the p-type $\zeta$-FeSi$_2$ amorphous film having a Si content of 72 at. % appears to be due to that the introduction of oxygen causes a direct bond between Fe and Si to be decreased and the formation of Fe—O—Si bond through oxygen ion or the formation of Fe—O and Si—O bonds to be increased, to thereby increase in its donor concentration.

Figure 5:
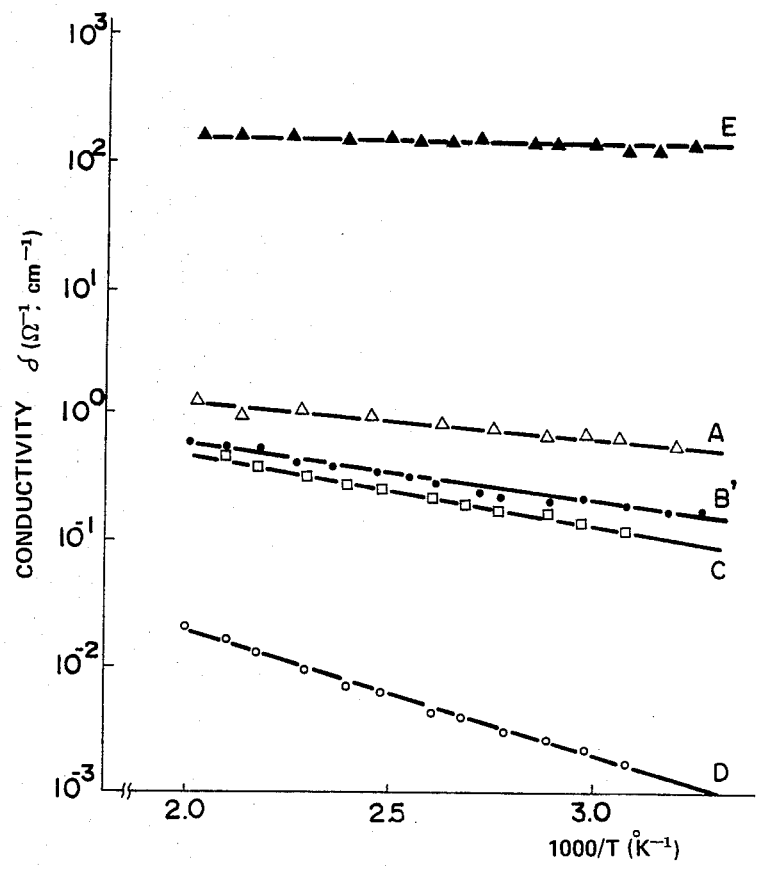
FIG. 5 is a graphical representation showing temperature characteristics of electrical conductivity of an anorphous film of the present invention.

Now, referring to FIG. 5 showing temperature characteristics of electrical conductivity measured on each of the amorphous films prepared in the manners mentioned above, reference characters A, C, D and E respectively indicate the p-type amorphous films in which composition ratios of Si to Fe are 68 at. %, 80 at. %, 83 at. % and 50 at. %, and B' indicating the amorphous film which has a Si content of 70 at. % and has its conduction type inverted into an n-type by introducing oxygen thereinto. As seen from FIG. 5, the amorphous film E of ε-FeSi having a Si content of 50 at. % has a conductivity of about $10^2 \Omega^{-1} cm^{-1}$ at a room temperature, and its temperature characteristics show that the film exhibits a metallic behavior rather than a semiconductor behavior. On the contrary, the p-type amorphous films A, C and D respectively having Si/Fe composition ratios of 68 at. %, 80 at. % and 83 at. % and the amorphous film B' having a Si/Fe composition ratio of 70 at. % and having its conduction type into an n-type exhibit a semiconductor behavior. Also, these amorphous films have a small conductivity as compared with the ε-FeSi amorphous film of metallic properties. More particularly, the film A having a Si/Fe composition ratio of 68 at. % has a conductivity of about $1\Omega^{-1} cm^{-1}$ at a temperature of 500° K., the n-type film B' having a Si content of 70 at. % and a film having 72 at. % of Si contained in a ζ-FeSi$_2$ phase (not shown) have a conductivity of about $0.8\Omega^{-1} cm^{-1}$, a conductivity of the film C having a Si content of 80 at. % is about 0.7 at. %, and a conductivity of the film D having a Si content of 83 at. % is about $0.02\Omega^{-1} cm^{-1}$. Thus, it will be readily noted that a Si content in excess of that of ζ-FeSi$_2$ solid solution causes a conductivity of the film to be suddenly decreased.

Thus, it is noted from the foregoing that the amorphous film formed of ε-FeSi phase has metallic properties, whereas the amorphous film having a composition of or similar to ζ-FeSi$_2$ phase exhibits a semiconductor behavior. In order to quantitatively clarify the fact or clear up conduction mechanism of these amorphous films, it is required to obtain information on a bonding manner of the constituent atons, the closest atomic distance and the like. However, the qualitative reason appears to be that the amorphous film of ε-FeSi phase having a coordination of a cubic system within a range of short-distance order has a metallic bond formed therein due to dominant 3d-electron bonding between Fe atoms, whereas the amorphous film of ζ-FeSi$_2$ phase exhibits a semiconductor behavior due to the fact that its crystal structure is a tetragonal system within a range of short-distance order.

Consideration was made on the fact that the p-type amorphous film of ζ-FeSi$_2$ having a Si content of 72 at. % (see FIG. 3) and the n-type amorphous film of ζ-FeSi$_2$ having oxygen incorporated thereinto (see FIG. 4) generate a large thermoelectromotive force. A temperature at which these films generate such high thermoelectromotive force is relatively high or 500°–600° K. Thus, it appears that this is due to the interaction with a carrier by the excitation of a magnon wave (quantized spin wave of a static magnetic mode). More particularly, the amorphous film of the present embodiment prepared according to the CIBD method has a good flat surface, little lattice defect and a uniform composition because of a migration effect peculiar to the CIBD method. Thus, the amorphous film meets a requirement for allowing a magnon wave of a high amplitude to be readily excited, so that the interaction with a carrier may remarkably appears.

Figure 6:
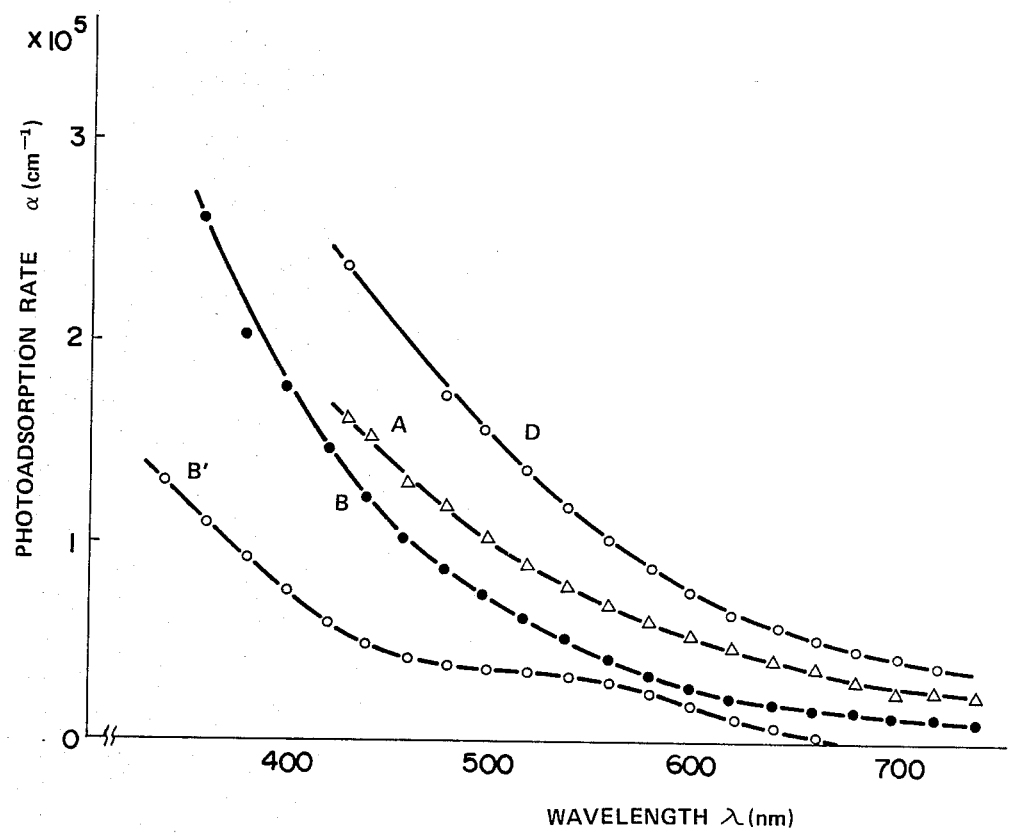
FIG. 6 is a graphical representation showing an optical absorption spectrum of an amorphous film of the present invention.

FIG. 6 shows optical absorption spectrum characteristics measured on the amorphous film of the present invention having a composition approximating ζ-FeSi$_2$ phase, wherein the abscissa axis indicates a wavelength λ(mm) and the ordinate axis indicates an absorptivity α(cm$^{-1}$), and reference characters A, B and D designate the p-type amorphous films in which composition ratios of Si to Fe are 68 at. %, 72 at. % and 83 at. %, respectively, and B' indicates the amorphous film having a Si/Fe composition ratio of 70 at. % and having its conduction type inverted into an n-type by incorporating oxygen thereinto. Each of these amorphous films had a thickness of 0.2–0.4 μm. The film B' having oxygen incorporated thereinto was light-brown and the films A, B and D were black-brown. Also, it was observed that the n-type amorphous film B' has a low absorptivity as compared with the other films. The film B' is transparent and has an absorption peak in a wave range between 550 nm and 580 nm which appears to be caused due to the transition of iron ion from $Fe^{3+}$ to $Fe^{2+}$, thus, it will be noted that the film B' has an absorption spectrum considerably different from the other p-type amorphous films. Furthermore, FIG. 6 clearly indicates that the film B of ζ-FeSi$_2$ having a Si content of 72 at. % has the highest transparency in all the amorphous films which do not have oxygen introduced thereinto and is decreased in transparency when its Si or Fe content is in excess of the composition range.

Figure 7:
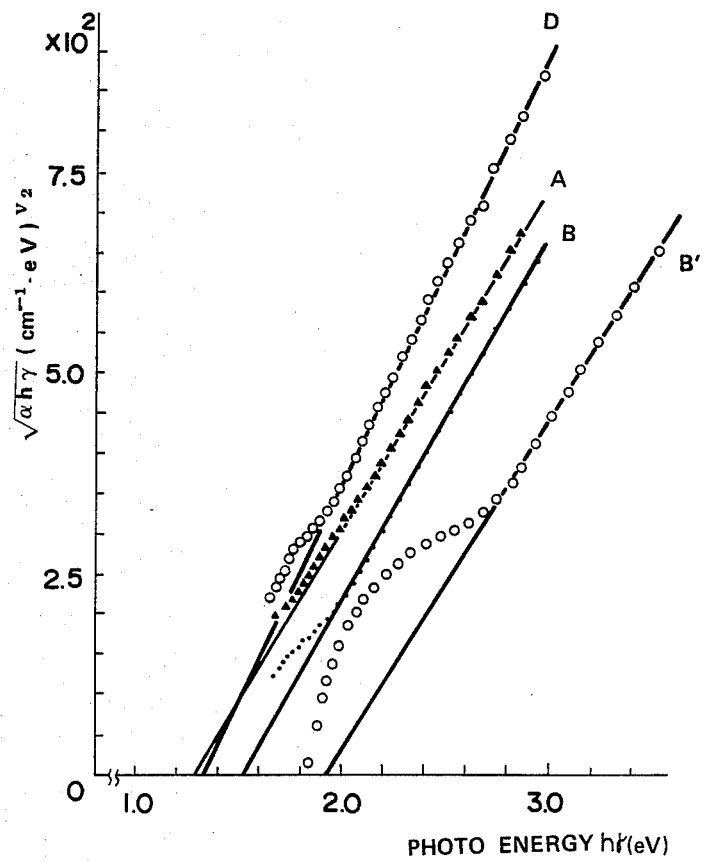
FIG. 7 is a graphical representation showing a correlation between optical absorptivity and photon energy in an amorphous film of the present invention.

A correlation between $(\alpha h\nu)^{\frac{1}{2}}$ of these amorphous films and photon energy hν which was sought in order to obtain information in the vicinity of an optical absorption edge is shown in FIG. 7. An optical band gap Ego of each of the films obtained on the basis of the information that the intersection between an extension of the linear portion of each film in a high energy region and the abscissa axis in FIG. 7 corresponds to an optical basic absorption edge of the film is shown in the following table.

| Specimen | Si Content (at. %) | Ego (eV) | Ea (eV) | Film Thickness (Å) |
|---|---|---|---|---|
| A | 68 | 1.258 | 0.173 | 3800 |
| B' | 70 | 1.920 | 0.124 | 2000 |
| B | 72 | 1.528 | 0.225 | 2200 |
| C | 80 | — | 0.096 | 5400 |
| D | 83 | 1.311 | 0.203 | 2600 |

As seen from the above results, the n-type film B' of ζ-FeSi$_2$ phase having oxygen introduced thereinto has the largest optical band gap Ego of about 1.92 eV (wave length: 0.65 μm) and has an optical absorption edge in a visible range. The p-type film B of ζ-FeSi$_2$ has an optical band gap Ego of about 1.53 eV (wavelength: about 0.81 μm) which is the second largest value. When a Fe and Si content is in excess of the composition range, the optical band gap Ego is decreased to about 1.3 eV (wavelength: about 0.95 μm). This Ego value is substantially equal to the Ego of Si. In the above table, an activation energy Ea of each film is also shown for reference which was sought on the basis of the above characteristics of each film. As clear from the table, the amorphous film B' having oxygen introduced thereinto has a donor level or donor activation energy Ea of about 0.12 eV and the amorphous films A, B and D have an acceptor level in a range of 0.17–0.23 eV. An activation energy of these films is in excess of at least ten times the typical impurity level in Si (Ea: about 0.026 eV). Thus, it will be noted that the ζ-FeSi$_2$ amorphous film has an impurity of a considerably deep energy level located therein.

A semiconductor containing a 3d-transition element such as Fe, Co, Cr, Mn, Ni, Ti or the like includes, other than silicide such as the Fe-Si compound mentioned above, oxide which appears to be an ionic crystal, halide, carbide which appears to be an interstitial type, sulfide and the like. It appears that crystallographic properties and physical properties of these materials have a close relation to the position and type of an electronegative element included therein, their crystal structure and the like. A significant difference between such semiconductor and a conventional semiconductor which does not contain a 3d-transition element is that the former semiconductor has various excellent electric conductivity and thermoelectric properties such as a Seebeck coefficient, a thermal conductivity and the like due to magnetic moment of a metallic element and often exhibits specific phenomena which cannot be solved according to a conventional simple semiconductor theory.

The embodiment of the present invention described hereinbefore relates to a silicide containing Fe as a transition element. However, it is a matter of course that the amorphous film of the present invention includes, in addition to Fe, a substitutional silicide with another transition element such as, for example, $Fe_{1-x}Co_xSi$. Also, according to the present invention, an amorphous film formed of silicide containing a 3d-transition element other than Fe and having the same tetragonal system as the $\zeta$-FeSi$_2$ amorphous film can be prepared which has substantially the same characteristics as the $\zeta$-FeSi$_2$ film.

As can be seen from the foregoing, the amorphous film formed of a 3d-transition element silicide according to the present invention is capable of resisting a high temperature of up to about 1000° C., generating a large thermoelectromotive force or having a large Seebeck coefficient, and having a relatively high conductivity. Thus, the amorphous film of the present invention is effectively put into practical use because it is significantly and substantially applicable to various kinds of thermoelectric converting elements.

As many apparently widely different embodiments of this invention may be made without departing from the spirit and scope thereof, it is to be understood that the invention is not limited to the specific embodiment thereof except as defined in the appended claims.

What is claimed as new and desired to be secured by Letters Patent of the United States is:

1. An amorphous film composed of a transition element-silicon compound which consists essentially of iron and silicon, wherein the content of said silicon is within the range of 60 atom percent through 85 atom percent, whereby said amorphous film contains a $\zeta$-FeSi$_2$ phase that is semiconductive.

2. The amorphous film as claimed in claim 1, wherein the iron in the transition element-silicon compound is partially replaced by a 3d-transition element selected from the group consisting of Co, Cr, Mn, Ni or Ti, whereby the 3d-transition element-silicon compound maintains a tetragonal crystal structure and is semiconductive.

3. The amorphous film as claimed in claim 1, wherein an effective amount of oxygen is introduced into the compound so as to invert the conductivity of the film.

4. The amorphous film as claimed in claim 3, wherein said film is a negative type film of $\zeta$-FeSi$_2$ having a Si content of 70 atom percent.

5. The amorphous film as claimed in claim 1, wherein said film is a positive type film $\zeta$-FeSi$_2$ having a Si content of 72 atom percent.

6. An amorphous film composed of a transition element-silicon compound which consists essentially of silicon and one or more 3d-transition elements selected from the group consisting of Co, Cr, Mn, Ni or Ti, wherein the content of silicon is within the range of 60 atom percent through 85 atom percent, whereby said transition element-silicon compound has a tetragonal crystal structure and is semiconductive.

* * * * *